United States Patent [19]

Stoisiek

[11] Patent Number: 4,509,068

[45] Date of Patent: Apr. 2, 1985

[54] THYRISTOR WITH CONTROLLABLE EMITTER SHORT CIRCUITS AND TRIGGER AMPLIFICATION

[75] Inventor: Michael Stoisiek, Ottobrunn, Fed. Rep. of Germany

[73] Assignee: Siemens Aktiengesellschaft, Berlin & Munich, Fed. Rep. of Germany

[21] Appl. No.: 413,122

[22] Filed: Aug. 30, 1982

[30] Foreign Application Priority Data

Sep. 29, 1981 [DE] Fed. Rep. of Germany ....... 3138762

[51] Int. Cl.³ ............................................ H01L 29/74
[52] U.S. Cl. ....................................... 357/38; 357/35; 357/43; 357/86; 307/252 A; 307/252 C; 307/570
[58] Field of Search ...................... 357/35, 38, 43, 86; 307/570, 252 A, 252 C

[56] References Cited

U.S. PATENT DOCUMENTS 4,224,634 9/1980 Suedberg ............................. 357/38
4,244,000 1/1981 Ueda et al. .......................... 357/38

Primary Examiner—Joseph E. Clawson, Jr.
Attorney, Agent, or Firm—Hill, Van Santen, Steadman & Simpson

[57] ABSTRACT

A power thyristor has controllable emitter short circuits in the form of MIS transistors which are conductive in the blocking condition of the thyristor and are switched off during the trigger operation. The ignition of the thyristor, including the control of the emitter short circuits, is accomplished in a simple manner from a gate trigger current pulse. To this end, a npn lateral transistor is integrated on the cathode side of the thyristor, the collector of the lateral transistor being connected to the gates of the MIS transistors, with its base consisting of a sub-region of the p-base and its emitter consisting of an edge region of the n-emitter of the thyristor. The gates of the MIS transistors are connected to the anode of the thyristor over a charging resistor.

7 Claims, 2 Drawing Figures

THYRISTOR WITH CONTROLLABLE EMITTER SHORT CIRCUITS AND TRIGGER AMPLIFICATION

BACKGROUND OF THE INVENTION

1. Field of the Invention

The present invention relates to thyristors and more particularly to thyristors which have controllable emitter short circuits.

2. The Prior Art

A thyristor having a controllable emitter short circuit is described in my co-pending application Ser. No. 370,497 filed Apr. 21, 1982. The thyristor described therein requires a control voltage pulse in addition to an ignition current pulse, with the two being coincident in time. It is desirable to provide a thyristor construction in which triggering is achieved in a simple manner from an applied ignition current pulse.

BRIEF DESCRIPTION OF THE INVENTION

It is the principle object of the present invention to provide a thyristor having a controllable emitter short circuit in which ignition is accomplished in a simple manner from an applied ignition current pulse.

In accordance with one embodiment of the present invention, there is provided a thyristor having a plurality of emitter short circuits comprising MIS transistors and a lateral transistor provided at the boundary surface of the thyristor and connected to the gates of the MIS transistors, a trigger electrode connected to a subregion of said lateral transistor, and means for connecting the gates of the MIS transistors to a positive voltage.

The present invention achieves the advantageous operation in that the electrical energy stored in the gate capacitance of the MIS structures during their blocked or inhibited condition is employed for the triggering of a thyristor, so that effective triggering operation is possible with a relatively low power externally supplied signal for triggering ignition.

These and other objects and advantages of the present invention will become manifest by an inspection of the following description and the accompanying drawings.

BRIEF DESCRIPTION OF THE DRAWINGS

Reference will now be made to the accompanying drawings in which.

DESCRIPTION OF THE PREFERRED EMBODIMENTS

Figure 1:
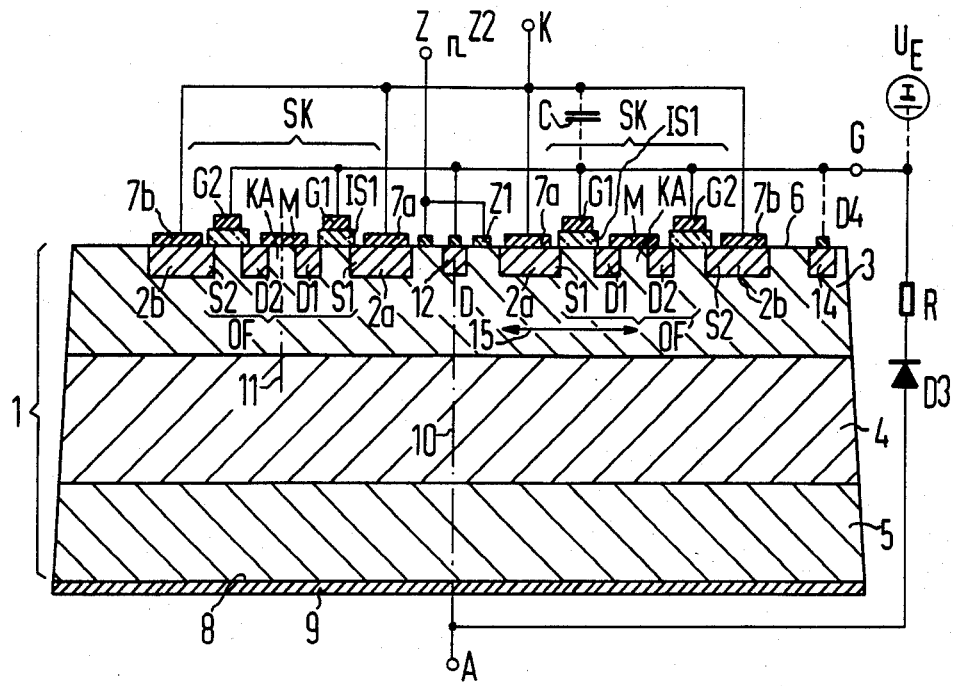
FIG. 1 is a cross sectional view of an illustrative embodiment of the present invention and FIG. 2 is an equivalent circuit of the apparatus of FIG. 1.

Referring now to FIG. 1, a thyristor has a body 1 consisting of monocrystalline semiconductor material, for example, silicon, which contains n-conductive layers 2a, 2b and 4 and p-conductive layers 3 and 5. The layer consisting of two parts 2a and 2b is also referred to as the n-emitter, the layer 3 as the p-base, the layer 4 as the n-base, and the layer 5 as the p-emitter. The parts 2a and 2b of the n-emitter are provided with coatings 7a and 7b of electrically conductive material, for example aluminum, at the boundary surface 6 of the semiconductor body 1. These coatings, together, form the cathode of the thyristor. They are connected to a terminal K. The p-emitter 5 is contacted in the opposite boundary surface 8 of the semiconductor body by an anode 9, consisting of electrically conductive material, for example aluminum. The anode 8 is provided with a terminal A.

The n-emitter 2a, 2b is provided in FIG. 1 with controllable emitter short circuits SK, each of which consist of a MIS field effect transistor, for example S1, D1, G1 or S2, D2, G2; and a projection KA of the p-base 3 extending up to the boundary surface; and a metallization bridge M placed on the boundary surface 6. The edge side region S1 of the n-emitter part 2a, represents a source region. A drain region D1, is n+ doped. A gate G1 consists of conductive material, separated from 6 by a thin, electrically insulating layer IS1 and wired to a terminal G. These parts form a MIS transistor which produces a low-resistance connection from the projection KA over M to the n-emitter part 2a in its conductive state. In an analogous manner, the parts S2, D2 and G2 form a second MIS transistor which produces a low-resistance connection between KA and the part 2b of the n-emitter in its conductive state. The metallization bridge M connects the projection KA to the drain regions D1 and D2.

When the thyristor arrangement according to FIG. 1, including the controllable emitter short circuits SK, is designed circularly-symmetrically relative to an axis 10, then the MIS structures respectively lie at the outer edge of an annular n-emitter part 2a and at the inner edge of an annular n-emitter part 2b. In a further development of this embodiment, a plurality of such MIS structures can also respectively separate a plurality of annular, concentric n-emitter parts from one another. The n-emitter parts 2a, 2b, however, can also be designed strip-wise and be flanked by strip-shaped MIS structures in a fingerlike structure.

Further, the arrangement according to FIG. 1 can also be designed so that, instead of the mutually separate n-emitter parts 2a and 2b, a self-contained n-emitter 2a, 2b is provided, which has a plurality of openings OF and OF' distributed as uniformly as possible. In this case, the reference symbols D1 and D2 only indicate different planes of section of the same annular n+ doped drain region, which is designed centrically-symmetrically relative to an axis 11. S1 and S2 then denote different planes of section of the same edge zone of the n-emitter 2a, 2b surrounding the opening OF. The drive and the fundamental manner of functioning of the controllable emitter short circuits SK remain uninfluenced by these alternative embodiments.

When the gate voltage, i.e., the voltage at G1 and G2 supplied over G, is zero relative to the part of the p-base 3 lying below, then the field effect transistors S1, G1, D1 and S2, G2, D2 are blocked, the emitter short circuits SK are suppressed, and the thyristor is in its condition of high trigger sensitivity. By means of applying a positive gate voltage, the short circuits ST can be switched on and the thyristor can be placed in a trigger-insensitive, stable condition. In order to control the MIS field effect transistors, the terminal G is connected over a high-resistance, current-limiting resistor R, and a diode D3 to the anode terminal A. In addition, a connection exists from G to the terminal of a further n+ doped zone 12, which is situated in tight proximity to the inner edge of the n-emitter 2a. The region of the p-base appearing at the surface between the inner edge of 2a and the n-doped region 12 is provided with a metallization A1. The inside edge of 2a, the region of the p-base 3 situated below A1, and the n+ zone 12 form emitter, base and collector of a npn lateral transistor. As soon as a positive voltage is provided to the anode 9, it is connected over the resistor R and the diode D3 to the terminal G, and leads to the thyristor being placed in a trigger-insensitive condition. The voltage at the capacitors of the gates G1, G2 can thereby become at most as large as the breakdown voltage of the pn junction between the region 12 and the p-base 3, i.e. approximately 10 to 20 voltages.

When a positive gate trigger current Z2 is supplied to the thyristor over the trigger electrode Z1, and an ignition circuit connected at Z for the purpose of initiating triggering, then said gate trigger current effects a drive of the npn transistor. As a result, the capacitances of the gates G1 and G2 discharge, so that the MIS field effect transistor is blocked and the thyristor is placed in a trigger-sensitive condition. Because of the relatively large gate capacitances of the MIS transistors, a strong discharge current flows, which is effective as an additional gate trigger current surge. By means of connecting an external capacitor C parallel to the gate capacitances, this additional gate trigger current surge can be further increased.

The cutoff voltage of the MIS field effect transistors should be so small that the forward voltage adjacent to the anode 9 after ignition suffices in order to again turn the emitter short circuits SK on. It is only then that, given a rapid rise of the positive voltage provided to A following the shut-down of the thyristor, the thyristor is protected against dV/dt ignition.

When the gate trigger current Z2 is switched off before the thyristor has been completely triggered, then the emitter short circuits SK must be prevented from becoming immediately effective and leading to an obstruction of the lateral trigger propogation. This can occur in that the time constant of the RC element formed of the gate capaictors (and the optional capacitor C) and the load resistor R is selected greater than the propogation time of the ignition front.

As a rule, the voltage adjacent to the anode 9 in the blocking condition of the thyristor is significantly greater than the break-down voltage of the npn transistor, which could lead to the unintentional triggering of the thyristor. Therefore, the resistor R must be selected large enough that the current flowing over D remains so small that it leads neither to the triggering of the thyristor nor to the destruction of the collector-base diode D.

According to a further development of the invention, a second diode D4 which exhibits a n+ doped region 14 connected to the terminal G is provided in a trigger-insensitive edge region of the thyristor. The breakdown voltage of D4 is selected to be lower than that of the collector-base diode D, so that D4 limits the gate voltage at G1 and G2. According to a circuit modification, D4 can also be replaced by an external diode.

Figure 2:
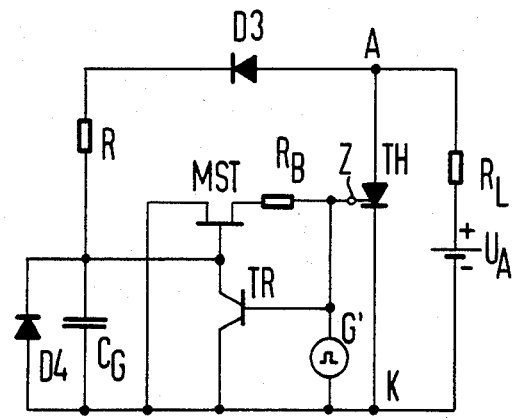

An equivalent circuit diagram of the arrangement illustrated in FIG. 1 is shown in FIG. 2. The thyristor Th is connected over a load resistor $R_L$ to an anode voltage source $U_A$. The MIS field effect transistor MST describes the short circuits SK connectible between the cathodes 7a, 7b and the p-base 3 of the thyristor. $R_B$ denotes the bulk resistance of the semiconductor body from the inside edge of the n-emitter region 2a up to the first short-circuit structure, i.e. along the double arrow 15 of FIG. 1; $C_G$ denotes the gate capacitance of the MIS field effect transistor MST; R denotes the charging resistor; and D3 denotes the diode over which the capacitor $C_G$ is charged by the anode voltage of the thyristor. D4 is the integrated or externally added diode for the gate voltage limitation. TR describes the npn lateral transistor whose emitter coincides with the inner edge region of the thyristor emitter.

The base terminal of the lateral transistor is connected to the trigger electrode Z1 of the thyristor and the emitter terminal of the transistor TR is connected to the terminal K. In the blocking condition of the thyristor, the voltage between K and the trigger electrode Z1 is so low that a noticeable electron injection occurs neither in the transistor TR nor in the thyristor TH. At the collector of TR, therefore, the break-down voltage of its collector-base junction or that of the diode D4 is set, depending upon which of the two is smaller. The gate capacitor of the MIS field effect transistor MST is charged to this voltage and MST is therefore in its conductive condition. In order to trigger the thyristor TH, the gate trigger current pulse from the gate trigger current generator G' is supplied to the p-base 3 and to the base of the npn transistor TR. TR becomes conductive and discharges $C_G$ to the terminal K, which is shared by the thyristor TH and the transistor TR. When the discharge current of $C_G$ is large enough, it leads to the ignition of the thyristor at the inside edge 16 of the n-emitter part 2a.

Since the discharge current of $C_G$ is greater than the gate trigger current pulse Z2 by the short-circuit forward current transfer ratio $\beta$ is sufficiently large. Thus, the present invention is concerned with an integrated gate trigger current amplification, in which the trigger energy during the forward and blocking periods is supplied by the anode voltage source $U_A$ and is stored in the gate capacitor of the MIS transistors up to ignition.

Deviating from the embodiment described up to now, the load circuit consisting of $D_3$ and R can be replaced by an external direct voltage source $U_E$ wired to the cathode K, as indicated with broken lines in FIG. 1.

Further, the emitter short circuits SK as well as the npn lateral transistor, can also be disposed at the p-emitter 5. FIG. 1 can be employed for illustrating this circuit alternative when the conductivity types of the semiconductor regions are replaced by the mutually opposite types, the terminals A and K are interchanged and the described voltages and currents are supplied with the respectively opposite polarity.

It will be apparent that various modifications and additions may be made in the apparatus of the present invention without departing from the essential features of novelty thereof, which are intended to be defined and secured by the appended claims.

What is claimed is:

1. A thyristor comprising a semiconductor body having an n-emitter contacted by a cathode, and an adjacent p-base, and a p-emitter contacted by an anode, and an adjacent n-base, and with a plurality of emitter short circuits disposed at a boundary surface of the semiconductor body comprising MIS transistors, each MIS transistor comprising an edge region of the n(p)-emitter, a n(p)-conductive semiconductor region inserted in the p(n)-base and conductively connected thereto, and a region of the p(n)-base covered by a gate, a lateral transistor provided at the boundary surface, said lateral transistor comprising an edge region of the n(p)-emitter, a further n(p)-conductive semiconductor region inserted in the p(n)-base and connected to the gates of the MIS transistors, and comprising a sub-region of the p(n)-base lying therebetween; said sub-region having a trigger electrode; and means for connecting the gates of the MIS transistors to a positive voltage.

2. The thyristor according to claim 1, including means for connecting the gates of the MIS transistors to an external voltage source.

3. The thyristor according to claim 1, including means for connecting the gates of the MIS transistors to the anode.

4. The thyristor according to claim 3, including means for connecting the gates of the MIS transistors to the anode over the series connection of a charging resistor and a diode.

5. The thyristor according to one of the claims 1 through 4, including means for connecting the gates of the MIS transistors to the cathode over a capacitor.

6. The thyristor according to one of claims 1-4, including means for connecting a further diode to the pn junction between the p(n)-base and the further n(p)-conductive semiconductor region inserted in the p(n)-base.

7. The thyristor according to claim 6, wherein said further diode is integrated in the p(n)-base.

* * * * *